(12) United States Patent
Hoang et al.

(10) Patent No.: US 9,112,655 B1
(45) Date of Patent: Aug. 18, 2015

(54) CLOCK DATA RECOVERY CIRCUITRY WITH PROGRAMMABLE CLOCK PHASE SELECTION

(71) Applicant: Altera Corporation, San Jose, CA (US)

(72) Inventors: Tim Tri Hoang, San Jose, CA (US); Weiqi Ding, Fremont, CA (US); Sangeeta Raman, San Jose, CA (US); Richard Hernandez, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/954,751

(22) Filed: Jul. 30, 2013

(51) Int. Cl.
  *H04L 25/38* (2006.01)
  *H04L 7/00* (2006.01)

(52) U.S. Cl.
  CPC ............ *H04L 7/0045* (2013.01); *H04L 7/0025* (2013.01)

(58) Field of Classification Search
  CPC .................................................... H04L 7/0025
  USPC ......................................................... 375/371
  See application file for complete search history.

(56) References Cited

U.S. PATENT DOCUMENTS

| 5,185,768 | A * | 2/1993 | Ferraiolo et al. ............ 375/373 |
| 8,279,992 | B1 | 10/2012 | Li |
| 8,284,887 | B2 | 10/2012 | Kikuchi et al. |
| 8,433,022 | B2 | 4/2013 | Onodera |
| 2003/0214335 | A1 * | 11/2003 | Saeki ............................ 327/165 |
| 2007/0180347 | A1 * | 8/2007 | Park .............................. 714/763 |
| 2007/0223494 | A1 * | 9/2007 | Hyyrynen et al. ....... 370/395.54 |
| 2009/0207960 | A1 * | 8/2009 | Takahashi ..................... 375/371 |
| 2011/0157263 | A1 * | 6/2011 | Kim et al. ..................... 345/698 |
| 2011/0199368 | A1 * | 8/2011 | Huang et al. .................. 345/213 |
| 2011/0199369 | A1 * | 8/2011 | Huang et al. .................. 345/213 |
| 2011/0298957 | A1 * | 12/2011 | Kim et al. ..................... 348/308 |
| 2012/0092051 | A1 * | 4/2012 | Erdogan ....................... 327/158 |
| 2012/0126854 | A1 * | 5/2012 | Yamaguchi ....................... 327/3 |
| 2012/0133394 | A1 * | 5/2012 | Fukuda et al. .................. 327/12 |

OTHER PUBLICATIONS

Mendel et al., U.S. Appl. No. 13/862,305, filed Apr. 12, 2013.
Lu et al., U.S. Appl. No. 13/249,954, filed Sep. 30, 2011.

\* cited by examiner

*Primary Examiner* — Santiago Garcia
(74) *Attorney, Agent, or Firm* — Treyz Law Group; Jason Tsai (57) ABSTRACT

Integrated circuits with high-speed communications capabilities are provided. Such types of integrated circuits may include clock data recovery (CDR) circuitry. The CDR circuitry may receive incoming data and may generate multiple clock signals that are used to latch the incoming data. The CDR circuitry may include data latching circuitry for separately latching even and odd data bits in alternating clock cycles. In particular, the data latching circuitry may be controlled using first, second, third, and fourth clock signals having different respective phase settings. The first and second clock signals may be used to capture even and odd data bits, respectively. The third and fourth clock signals may be used to sample data near the transition between the even and odd data bits. The phase of the first and second clock signals may be dynamically adjusted. The phase setting that yields the optimal link performance may be selected for normal operation.

21 Claims, 8 Drawing Sheets

| SAMPLED BITS | | | PD ACTION |
|---|---|---|---|
| A | T | B | |
| #1 | 0 | 0 | 1 | EARLY→SLOW DOWN VCO |
| #2 | 1 | 1 | 0 | EARLY→SLOW DOWN VCO |
| #3 | 0 | 1 | 1 | LATE→SPEED UP VCO |
| #4 | 1 | 0 | 0 | LATE→SPEED UP VCO |
| #5 | 0 | 0 | 0 | DON'T CARE |
| #6 | 1 | 1 | 1 | DON'T CARE |

CLOCK DATA RECOVERY CIRCUITRY WITH PROGRAMMABLE CLOCK PHASE SELECTION

BACKGROUND

This relates generally to communications links, and more particularly, to high-speed input-output (I/O) communications links.

A typical communications link includes a transmitter, a receiver, and a channel that connects the transmitter to the receiver. The transmitter transmits a serial data bit stream to the receiver via the channel. Typical high-speed transmit data rates are 1 Gbps (gigabits per second) to 10 Gbps. Communications links operating at such high data rates are often referred to as high-speed serial links or high-speed input-output links.

Typically, the transmitter outputs the data bits at periodic intervals using a transmitter clock signal with 50% duty cycle while the receiver latches incoming serial data bits using data latching circuits. The receiver may include clock data recovery (CDR) circuitry that generates a clock signal having transitions aligned to the center of each data bit (i.e., the clock signal has rising and falling edges centered within each data bit window).

Centering the clock signal transitions within each data bit window may be desirable if the setup and hold time requirements associated with the data latching circuits are equal. In practice, however, the setup and hold time requirements are often different. For example, consider a scenario in which a pre-charge sense amplifier circuit in a data latching circuit exhibits a setup time that is substantially less than its hold time. In this scenario, positioning the clock edges at the center of each data window would be inefficient as some timing margin would be wasted in the hold region. As another example, consider a scenario in which the receive data bits exhibit a distorted data eye that is skewed towards the right. In this scenario, positioning the clock edges at the center of the distorted data eye would also be inefficient as some timing margin would be wasted in the setup region.

SUMMARY

Methods and apparatus for performing dynamic clock phase selection in high-speed communications systems are provided. An integrated circuit in a high-speed communications system may be used to receive incoming data bits over a communications link. The integrated circuit may include clock data recovery (CDR) circuitry that generates multiple clock signals at least some of which are aligned to the incoming data bits and data latching circuitry for capturing the incoming data bits using the clock signals.

The CDR circuitry may include an adjustable oscillator circuit (e.g., a voltage-controlled oscillator) operable to generate four clock signals with different phase settings and four data latches each of which is configured to receive a respective one of the four clock signals via an associated multiplexer. For example, a first multiplexer associated with a first data latch may receive a first of the four clock signals and another clock signal that is phase shifted with respect to the first clock signal. A second multiplexer associated with a second data latch may receive a second of the four clock signals and another clock signal that is phase shifted with respect to the second clock signal. A third multiplexer associated with a third data latch may receive a third of the four clock signals and a ground power supply voltage signal. A fourth multiplexer associated with a fourth data latch may receive a fourth of the four clock signals and the ground power supply voltage signal. The four multiplexers are configured to route selected clock signals to the control input of each corresponding data latch.

Each data latch may receive the incoming data bits. The first data latch may be used to capture "even" data bits. The second data latch may be used to capture "odd" data bits. The third and fourth data latches may be used to capture values in the incoming data stream where transitions between successive data bits occur. In response to determining that the third and fourth clock signals are either early or late with respect to the transitions, the four clock signals may collectively be sped up or slowed down by adjusting the frequency and/or phase of the four clock signals.

An eye quality monitoring circuit may be used to monitor the data bits captured by the first and second data latches and may be used to obtain link performance measurements such as bit error rate measurements. Based on these measurements, the clock signals received by the first and second data latches may be changed (e.g., the first and second data latches may receive clock signals with different phase settings during different time periods by performing selectively routing with the first and second multiplexers) while the phase settings of the third and fourth clock signals that control the third and fourth data latches remain unaltered. The phase setting that yields the optimal bit error rate measurement may be selected for use in controlling the data latches during normal operation.

Further features of the present invention, its nature and various advantages will be more apparent from the accompanying drawings and the following detailed description.

DETAILED DESCRIPTION

Embodiments of the present invention relate to communications links, and more particularly, to methods for improving the performance of communications links. It will be recognized by one skilled in the art, that the present exemplary embodiments may be practiced without some or all of these specific details. In other instances, well-known operations have not been described in detail in order not to unnecessarily obscure the present embodiments.

Communications links are commonly used to convey data between separate integrated circuits packages, printed circuit boards, etc. Such communications links may be used to connect integrated circuits that include communications capabilities, such as memory chips, digital signal processing circuits, microprocessors, application specific integrated circuits, programmable logic device integrated circuits, field-programmable gate arrays, application specified standard products, or any other suitable integrated circuit.

Figure 1:
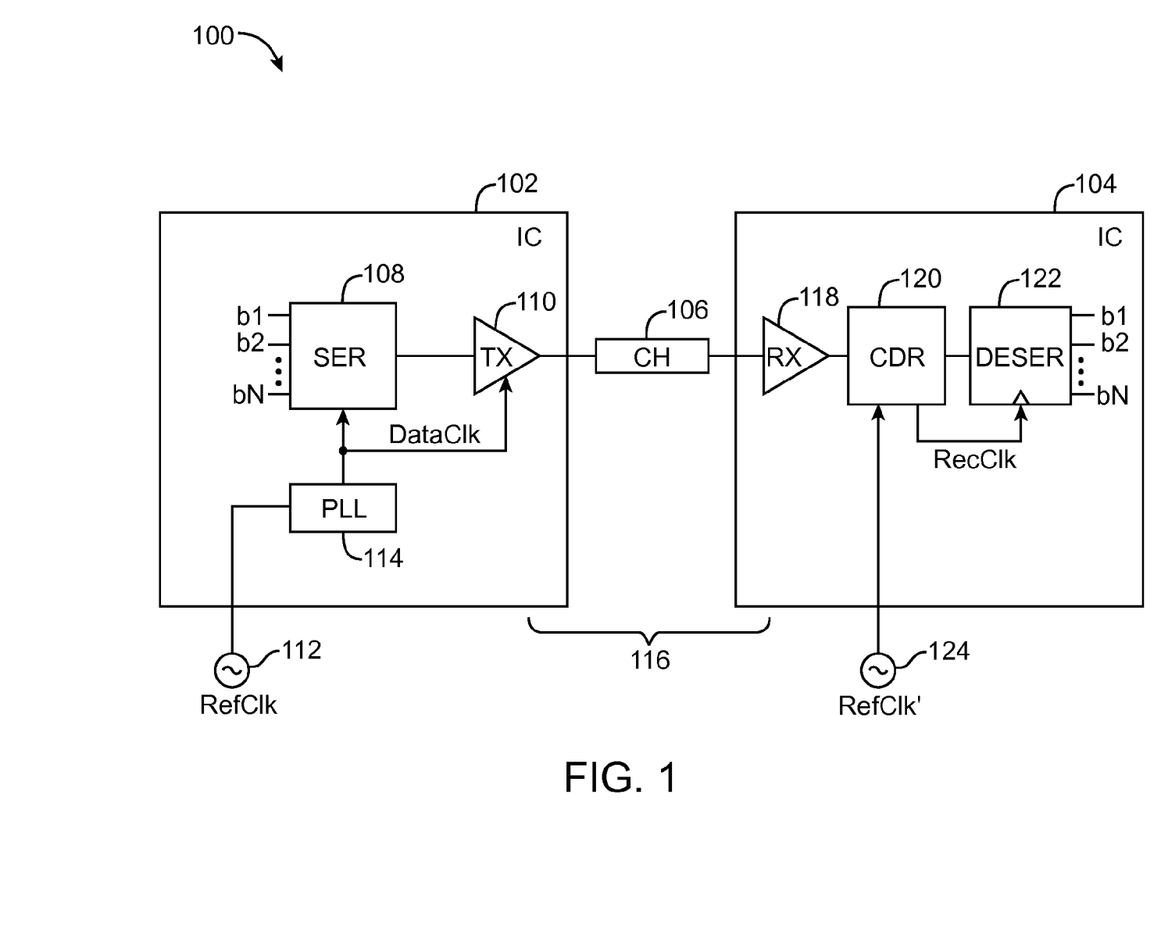
FIG. 1 is a circuit block diagram of an illustrative communications link in accordance with an embodiment of the present invention.

A "high-speed" link might, as an example, carry data at 10 gigabits per second. A high-speed communications system is shown in FIG. 1. Communications system 100 may include transmitter (TX) circuitry such as TX circuitry 102, a channel such as channel 106, and receiver (RX) circuitry such as RX circuitry 104. Channel 106 may connect TX circuitry 102 to RX circuitry 104 (e.g., circuitry 102 may produce data that is to be transmitted to circuitry 104 over link 116).

TX circuitry 102 may be formed on a first integrated circuit while RX circuitry 104 may be formed on a second integrated circuit (as an example). Integrated circuit devices 102 and 104 may be mounted on a printed circuit board (PCB). Transmitter circuitry 102 may convey data to RX circuitry 104 through channel 106. If desired, more than one channel may be used to link TX circuitry 102 to RX circuitry 104.

Channel 106 may be formed from any suitable physical transmission medium. Examples of transmission paths that may be used in channel 106 include differential signaling paths made up of pairs of conductive wires, coaxial cable paths (e.g., a CAT 5 cable), fiber optic cable paths, traces on printed circuit boards, combinations of such paths, backplane connectors, or other suitable communications link paths. In a typical system, integrated circuits 102 and 104 may be mounted on one or more circuit boards and channel 110 may involve transmission line structures fabricated on the circuit board or boards.

This example is merely illustrative. Communications link of the type described in connection with FIG. 1 may be used provide data transport between integrated circuits, printed circuit boards, circuits within a single integrated circuit, etc.

In the example of FIG. 1, integrated circuit 102 contains a transmitter 110 and integrated circuit 104 contains a corresponding receiver 118. A single channel 106 is used to connect transmitter 108 to receiver 112. This is merely illustrative. If desired, integrated circuit 102 may contain multiple transmitters 110, whereas integrated circuit 104 may contain multiple corresponding receivers 118. Multiple communications paths may be used to link the transmitters and receivers. Integrated circuit 102 may also include one or more receivers that receive data from one or more corresponding transmitters on integrated circuit 104. Data may also be conveyed to and from additional integrated circuits using transmitters 110 and receivers 118.

Transmitter circuitry 102 may also include a serializer circuit such as serializer 108 and a TX phase-locked loop (PLL) such as phase-locked loop 114. Serializer 108 may be used to convert parallel data bits b1-bN into a serial bit stream for data transmission.

The serial data bit stream may be fed to transmitter 110 for transmission over channel 106. Transmitter 110 may include a TX equalizer circuit and a TX data driver circuit. The equalizer may be used to provide high-frequency and direct signal level boosting to compensate for high-frequency signal loss commonly seen in high-speed serial links (e.g., losses in copper-based channels that exhibit undesired low-pass transfer characteristics that result in signal degradation at high data rates) or to enhance signal to noise ratio (SNR) in scenarios in which uncorrelated noise such as crosstalk is present.

The TX equalizer may output equalized data to the TX driver. The TX driver may have an output that is connected to a first terminal of channel 106. The output of the TX driver may have an output differential resistance of 100 Ohms to provide impedance matching with channel 106 (e.g., the first terminal of channel 106 may have an input differential resistance of 100 Ohms). The TX driver may be used to provide sufficient drive strength to drive the serial data stream across channel 106.

Phase-locked loop 114 may receive a transmit reference clock signal RefClk having a frequency fref from an off-chip crystal oscillator 112 (as an example). Phase-locked loop 114 may be used to produce a desired transmit data clock signal DataClk to control data serializer 108 and transmitter 110. Transmit control signal DataClk may exhibit a frequency that is an integer multiple of the frequency of RefClk (e.g., DataClk may have a frequency that is equal to k*fref, where k is any suitable integer).

For example, consider a scenario in which signal RefClk has a clock rate of 500 MHz. The data clock signal DataClk may have a transmit clock rate of 2 GHz, 2.5 GHz, 5 GHz, 18 GHz, etc. In one suitable arrangement, TX circuitry 102 may transmit the serial data bit stream with a transmit data rate that is equivalent to the clock rate of signal DataClk. Consider a scenario in which the transmit clock rate is equal to 15 GHz. In this scenario, transmitter 110, which is controlled by DataClk, will transmit data at a transmit data rate of 15 Gbps. In another suitable arrangement sometimes referred to as a half-rate transmission architecture, data can be transmitted at 30 Gbps if both rising and falling edges of signal DataClk are used to clock the data. Embodiments of the present invention generally relate to such types of half-rate transceiver systems.

Channel 106 may have a second terminal that is connected to receiver 118 in RX circuitry 104. Circuitry 104 may also include clock data recovery (CDR) circuitry such as CDR circuitry 120 and a deserializer circuit such as deserializer 122. Receiver 118 may include an RX buffer circuit and an RX equalizer circuit. The RX buffer circuit may receive data from channel 106. The RX buffer may have an input differential resistance of 100 Ohms for impedance matching (e.g., the second terminal of channel 66 has an output differential resistance of 100 Ohms). The RX buffer may provide additional pre-amplification for the received data, if desired. The RX buffer may output the received data bits the RX equalizer. The RX equalizer may provide further high-frequency boosting or direct signal level boosting to compensate for any additional undesired high-frequency signal loss.

Receiver 118 may provide the received data bits to CDR circuitry 120. Clock data recovery circuitry 120 may receive a reference clock signal RefClk' from off-chip crystal oscillator 124 (as an example). Signal RefClk' may exhibit a frequency that is substantially equal to frequency of TX reference clock RefClk. Clock data recovery circuitry 120 may be used to generate a recovered data clock signal based on the received data (e.g., CDR circuitry 120 may generate a recovered clock signal that is in phase with the incoming data bits). As an example, CDR circuitry 120 may include a phase-locked loop that receives signal RefClk' and that generates a corresponding recovered clock signal.

Consider a scenario in which the data rate of the received data is 30 Gbps and the clock rate of signal RefClk' is 500 MHz. Assuming a half-rate transmission scheme, CDR circuitry 120 may use its PLL to generate a recovered data clock signal RecClk having a clock rate that is equal to 15 GHz (e.g., the recovered clock may have a clock rate that is equal to half of the data rate of the received data). The recovered data clock signal may also be used to control deserializer 122. Deserializer 122 may serve to convert the serial data bit stream back into parallel bits. Deserializer may also include data latching circuits for latching the received data bits. The data latching circuits may sometimes be considered to be part of clock data recovery circuitry 120.

All the components in system 100 may be implemented using differential architectures. For example, transmitter 110 and receiver 118 may have differential inputs and differential outputs instead of single-ended inputs and outputs. Similarly, the data transmitted over channel 106 may be in the form of differential signals.

Data signals that are being conveyed from device 102 to device 104 via link 116 may be characterized by an overall link metric. The overall link metric may be a bit error rate (BER), as an example. Bit error rate may be defined as the ratio of the number of error bits (e.g., received bits that have been corrupted by noise, jitter, interference, etc.) to the total number of transmitted bits within a given time period.

For example, consider a scenario in which two terabits were transmitted within five seconds. There may be two incorrect bits that were transferred erroneously. The BER is therefore $10^{-12}$ (2 divided by $2*10^{12}$). For high-speed communications system such as system 100, it may be desirable to set the BER to $10^{-12}$ or smaller (e.g., $10^{-13}$, $10^{-15}$, $10^{-18}$, etc.).

Figure 2:
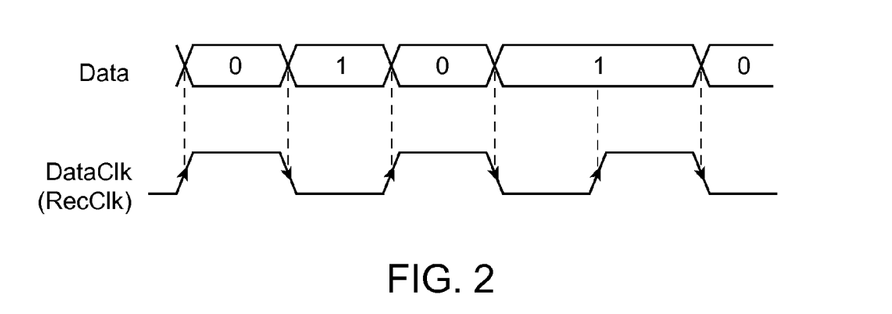
FIG. 2 is a diagram showing a half-rate data transmission scheme in accordance with an embodiment of the present invention.

FIG. 2 is a diagram showing an illustrative serial data bit stream that can be transmitted via channel 106. A half-rate transceiver arrangement is shown in FIG. 2 in which the serial data bit stream having data bits "010110 . . . " toggles at each rising and falling edge of transmit clock signal DataClk. As shown in FIG. 2, the recovered clock signal RecClk should be substantially similar to DataClk (e.g., RecClk should exhibit the same frequency as DataClk and should have edges that are phase aligned to the data bit transitions). If desired, the recovered clock signal may be phase shifted by a predetermined amount with respect to the data bits.

Figure 3:
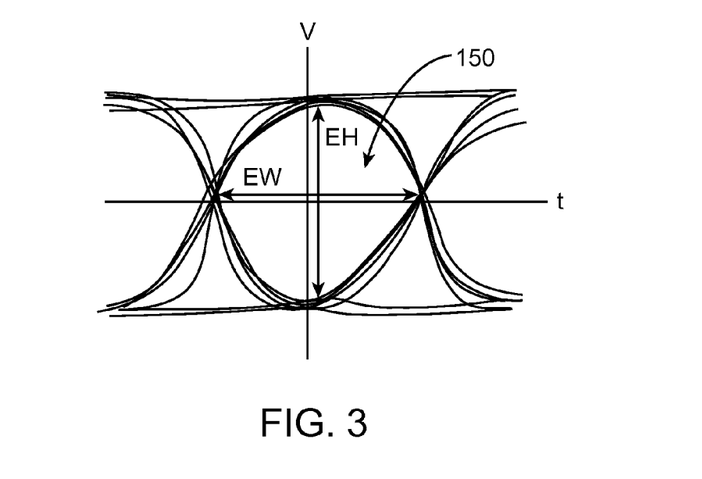
FIG. 3 is an eye diagram of an illustrative data stream in accordance with an embodiment of the present invention.

FIG. 3 shows an exemplary eye diagram of the transmitted data bits. The eye diagram may be formed by repetitively sampling the incoming data bits at regular time intervals and by overlaying the sampled information. As shown in FIG. 3, the eye diagram displays an eye opening 150 that is characterized by an eye width EW and an eye height EH. Ideally, the eye width is equal to half the clock period of signal DataClk (assuming a half-rate data transmission architecture), whereas the eye height is equal to the full rail differential voltage swing. In practice, however, jitter, noise, variations in operating voltage, variations in operating temperature, and other sources of random variation may reduce the size of eye opening 150. As an example, jitter may cause variation in time, which degrades eye width EW. As another example, noise may cause variation in voltage, which degrades eye height EH.

Figure 4:
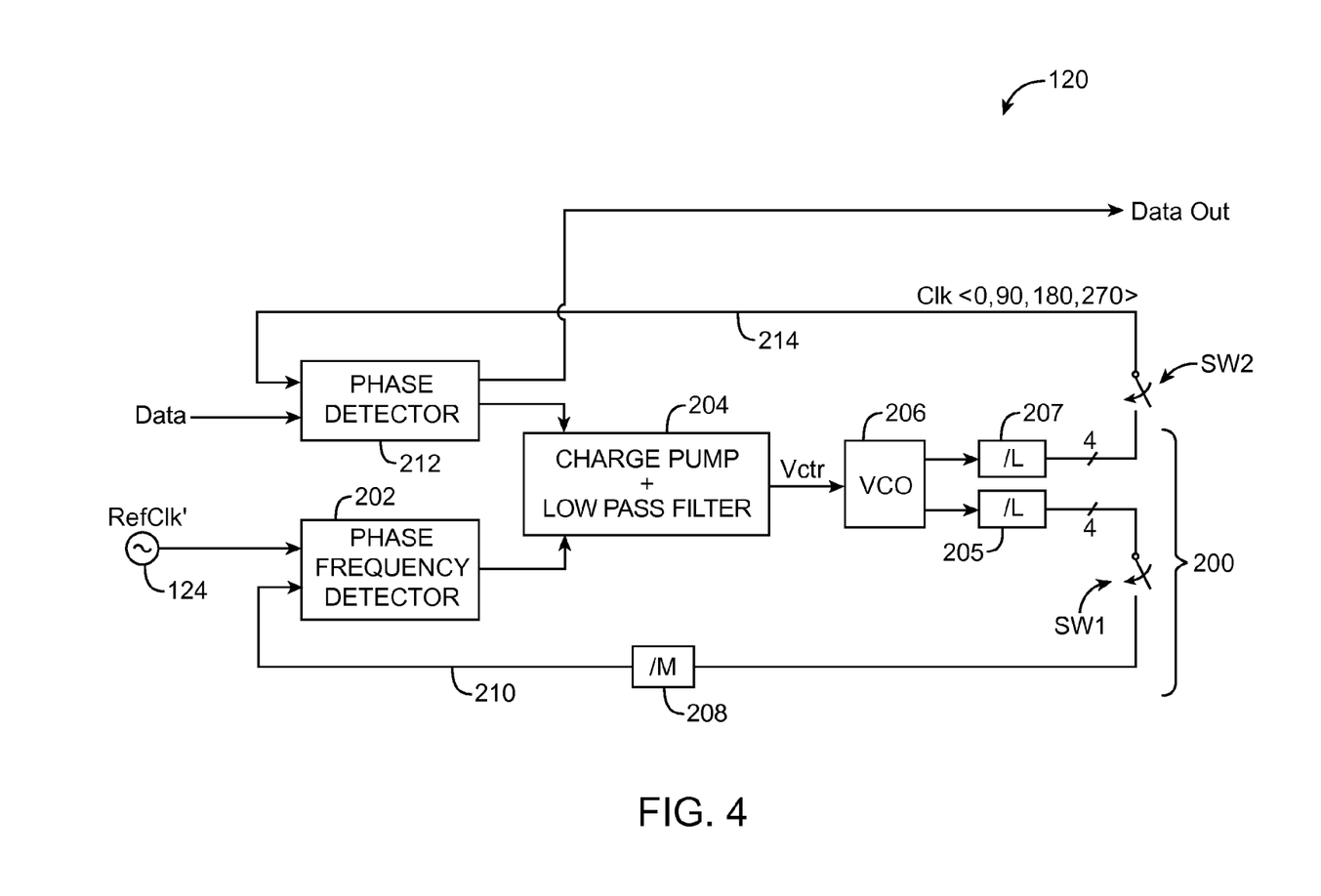
FIG. 4 is a diagram of illustrative clock data recovery circuitry in accordance with an embodiment of the present invention.

FIG. 4 shows one suitable arrangement of CDR circuitry 120. As shown in FIG. 4, circuitry 120 may include a phase frequency detector (PFD) circuit such as PFD 202, charge pump and low pass filter circuitry 204, a voltage-controlled oscillator (VCO) circuit such as VCO 206, divider circuits such as frequency dividers 205, 207, and 208, a phase detector (PD) circuit such as phase detector 212, and switches SW1 and SW2.

Charge pump and low pass filter circuitry 204 may output a control signal Vctr that controls VCO 206. Voltage-controlled oscillator 206 may have an output on which a signal having a frequency that depends on the value or magnitude of Vctr is provided. The output of VCO 206 may be fed back to an input of PFD 202 via switch SW1 and frequency dividers 205 and 208. In particular, PFD 202 has a first input that receives signal RefClk' from clock source 124, a second input that is coupled to frequency divider 208 via path 210, and an output that is coupled to circuitry 204. In the example of FIG. 4, frequency divider circuit 205 may be used to provide a division factor that is equal to L, whereas frequency divider circuit 208 may be used to provide a division factor that is equal to M. Factors L and M can be any suitable positive integer (e.g., 1, 2, 4, 5, 8, 10, 16, 20, 25, etc.).

Circuitry 204, VCO 206, dividers 205 and 208, and phase frequency detector 202 may be coupled in a closed loop configuration by turning on switch SW1 (while switch SW2 is turned off) and may collectively be referred to as a phase-locked loop (PLL) 200. Phase frequency detector 202 may serve to compare the frequency and phase of the signals presented at its first and second inputs and to generate a corresponding signal at its output to adjust circuitry 204 accordingly. Operated in this way, PFD 202 may be used to ensure that the signal at its second input exhibits a frequency that is equal to that of signal RefClk'. As a result, VCO 206 may be configured to output clock signals having a frequency that is locked to some integer multiple of the frequency of RX reference clock RefClk'.

Still referring to FIG. 4, VCO 206 may have another output that is fed back to an input of phase detector 212 via divider 207 and switch SW2. In particular, PD 212 may have a first input that receives data bits Data from receiver 118 (FIG. 1), a second input that is coupled to switch SW2 via path 214, and an output that is coupled to circuitry 204. The second input of phase detector 212 may receive clock signals from the output of VCO 206. Phase detector 212 may serve to compare only the phase of the signals presented at its first and second inputs and to generate a corresponding signal at its output to adjust circuitry 204 accordingly.

Operated in this way, PD 212 may be used to ensure that some of the clock signals at its second input is in-phase with the incoming data (e.g., to shift the clock signals on path 214 so that at least one of the clock signals has rising/falling clock edges that are aligned to the data bit transitions). In the example of FIG. 4, VCO 206 may output four phase detector clocking signals Clk<0,90,180,270> onto feedback path 214. The second PD clock signal Clk<90> may be delayed by 90° with respect to the first PD clock signal Clk<0>; third PD clock signal Clk<180> may be delayed by 180° with respect to Clk<0>; and fourth PD clock signal Clk<270> may be delayed by 270° with respect to Clk<0> (i.e., the phase detector clock signals may be phase shifted by a quarter clock cycle with respect to one another). This is merely illustrative. In general, VCO 206 may output more or less than four clock signals having different respective phase settings.

Switch SW1 may be activated during a first (frequency locking) time period, whereas switch SW2 may be activated during a second (data-phase aligning) time period. Only one of switches SW1 and SW2 should be turned on at any given point in time. Switch SW2 should only be turned on after PLL 200 has been activated to lock the output of VCO 206 to the desired frequency. Clock data recovery circuitry 120 of the type shown in FIG. 6 is sometimes referred to as a PLL-based or "analog" CDR circuitry.

In an embodiment of the present invention, phase detector 212 may include data latching circuitry having an input that receives data bits Data, a clock input that receives the clock signals from VCO 206 over path 214, and an output on which latched data bits DataOut are provided. The data latching circuitry may include data registers (e.g., positive-edge-triggered flip-flops and/or negative-edge-triggered flip-flops), level sensitive latches (e.g., pulse latches), or other clocked storage elements for latching incoming data at both rising and falling clock edges of the clock signals on path 214 (assuming a half rate transmission architecture).

Figure 5:
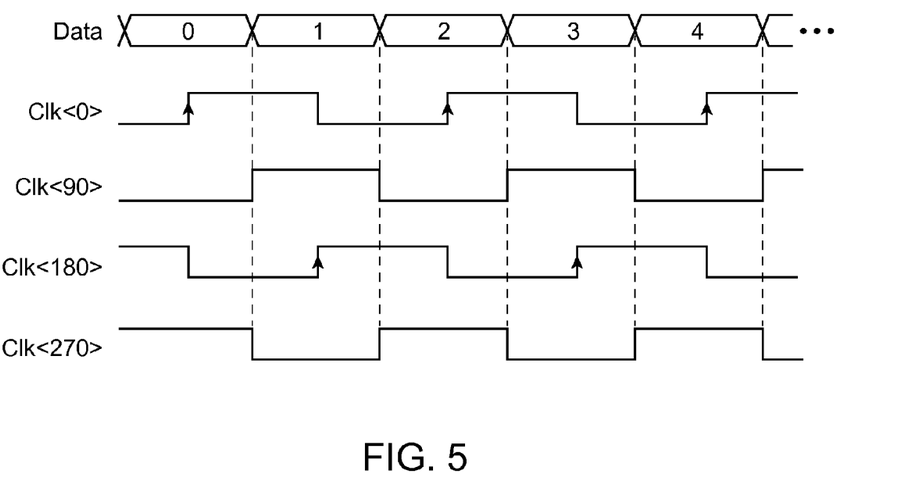
FIG. 5 is a timing diagram showing clock signals with different phase settings that can be used to latch incoming data bits in accordance with an embodiment of the present invention.

FIG. 5 is a timing diagram showing an illustrative timing relationship between incoming data bits and the phase detector clock signals Clk<0,90,180,270>. As shown in FIG. 5, signals Clk<90> and Clk<270> have rising/falling clock edges that are aligned with the data bit transitions. The alignment of the clock edges to the data bit transitions may be performed using phase detector 212. Meanwhile, signal Clk<0> may have rising edges that are positioned at the center of each "even" data bit window, whereas signal Clk<180> may have rising edges that are positioned at the center of each "odd" data bit window. Arranged in this way, signal Clk<0> may be provided to a first data latching element to capture the even data bits (e.g., data bits having indices 0, 2, 4, etc.), whereas signal Clk<180> may be provided to a second data latching element to capture the odd data bits (e.g., data bits having indices 1, 3, 5, etc.).

Figure 6:
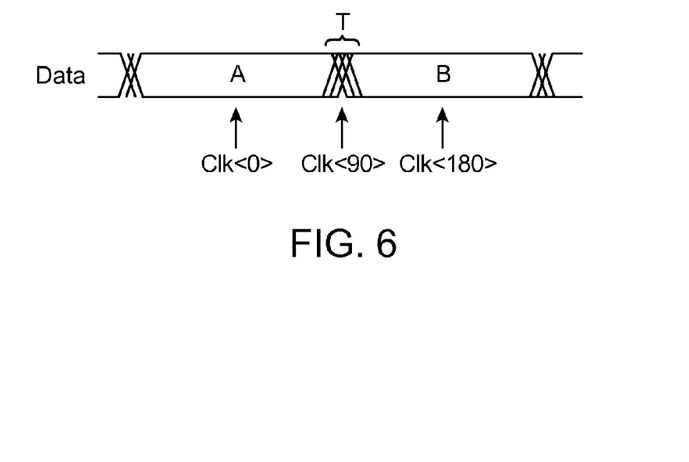
FIG. 6 is a diagram showing how the different clock signals as shown in FIG. 5 can be used to sample consecutive data bits and the transition from one data bit to the next in accordance with an embodiment of the present invention.

FIG. 6 is a diagram showing how some of the phase detector clock signals may be centered within each data bit window. FIG. 6 shows a scenario in which an incoming serial data stream includes a data bit "A" that is immediately followed by data bit "B." In this example, signal Clk<0> may have its rising edge currently centered in the data window of data bit A, whereas signal Clk<180> may have its rising edge currently centered in the data window of data bit B. As a result, signal Clk<90> will have a rising edge that is approximately positioned at the transition period during which the value of data bit A changes to the value of data bit B.

Signal Clk<0> may be used to sample data bit A by latching the incoming data at a rising clock edge of Clk<0>. Similarly, Clk<180> may be used to sample data bit B by latching the incoming data at a rising clock edge of Clk<180>. Signal Clk<90> may also be used to sample the incoming data at the transition between A and B. The data sampled by signal Clk<90> may have a value T that can be used to determine whether the PD clock signals are "early" or "late" with respect to the actual transition from A to B. Information gathered in this way may be used to dynamically configure phase detector 212 so as to adjust the collective phase settings of the PD clock signals to ensure that the edges of signals Clk<0> and Clk<180> are positioned at the center of the even and odd data windows, respectively.

Figure 7:
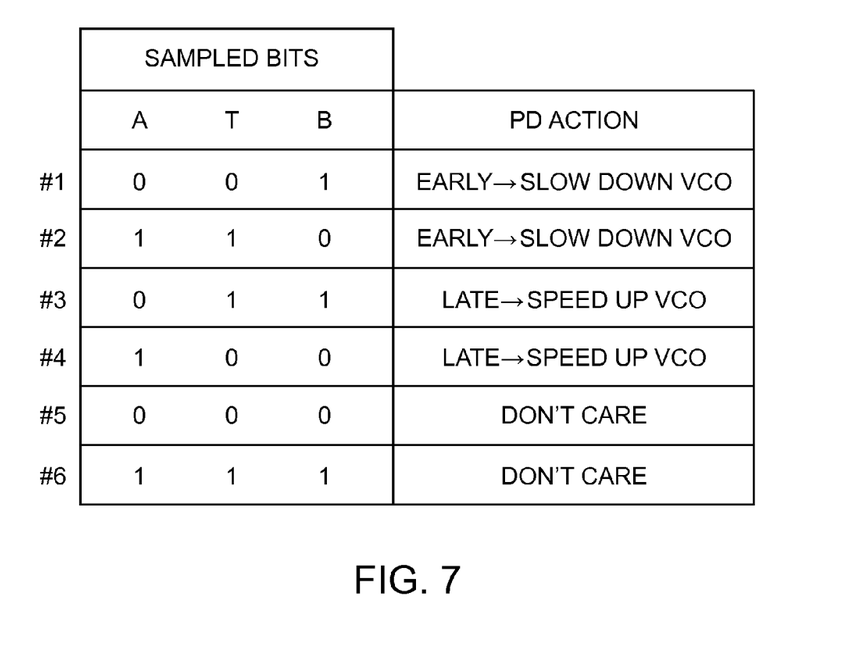
FIG. 7 is a table showing illustrative operations that can be performed by a phase detector in clock data recovery circuitry in response to different sampling patterns obtained using the scheme of FIG. 6 in accordance with an embodiment of the present invention.

The phase settings of the PD clock signals may be adjusted based on the values sampled by the different clock signals. FIG. 7 shows different possible scenarios that may occur when sampling incoming data with the PD clock signals. In scenario #1, in response to sampling a logic "0" with Clk<0> (i.e., if A is low), a logic "0" with Clk<90> (i.e., if T is low), and a logic "1" with Clk<180> (i.e., if B is high), phase detector 212 may determine that the PD clock signals are early (because the sampled transition value is same as the earlier data bit A) and thus will direct circuitry 204 to issue control signals Vctr to slow down VCO 206. In scenario #2, in response to sampling a logic "1" with Clk<0> (i.e., if A is high), a logic "1" with Clk<90> (i.e., if T is high), and a logic "0" with Clk<180> (i.e., if B is low), phase detector 212 may also determine that the PD clock signals are early and thus will direct circuitry 204 to issue control signals Vctr to slow down VCO 206. In general, when the PD clock signals are early, phase detector 212 will issue a "down" pulse to charge pump 204, which effectively delays the phase of the PD clock signals (i.e., shifts the PD clock signals later in time).

In scenario #3, in response to sampling a logic "0" with Clk<0> (i.e., if A is low), a logic "1" with Clk<90> (i.e., if T is high), and a logic "1" with Clk<180> (i.e., if B is high), phase detector 212 may determine that the PD clock signals are late (because the sampled transition value is same as the later data bit B) and thus will direct circuitry 204 to issue control signals Vctr to speed up VCO 206. In scenario #4, in response to sampling a logic "1" with Clk<0> (i.e., if A is high), a logic "0" with Clk<90> (i.e., if T is low), and a logic "0" with Clk<180> (i.e., if B is low), phase detector 212 may also determine that the PD clock signals are late and thus will direct circuitry 204 to issue control signals Vctr to speed up VCO 206. In general, when the PD clock signals are late, phase detector 212 will issue an "up" pulse to charge pump 204, which effectively reduces the phase of the PD clock signals (i.e., shifts the PD clock signals earlier in time).

In scenarios #5 and #6, when the data values do not change (i.e., when consecutive data bits remain constant), no transition is present and thus determination of phase cannot be made. In either of these scenarios, no action needs to be taken by phase detector 212. Operated using the approach illustrated in FIG. 7, phase detector 212 may be configured to continuously adjust the phase settings of PD clock signals Clk<0,90,180,270> to track any timing shift (or jitter) in the incoming data signals. In an ideal scenario in which the incoming data stream exhibits no jitter, PD 212 will shift the transition sampling clock signals (e.g., Clk<90> and Clk<180>) back and forth around the data transition edge in an alternating fashion. Phase detector 212 that dynamically shifts the PD clock signals back and forth in time to track data jitter in this way is sometimes referred to as a "bang-bang phase detector" (BBPD) circuit.

Figure 8:
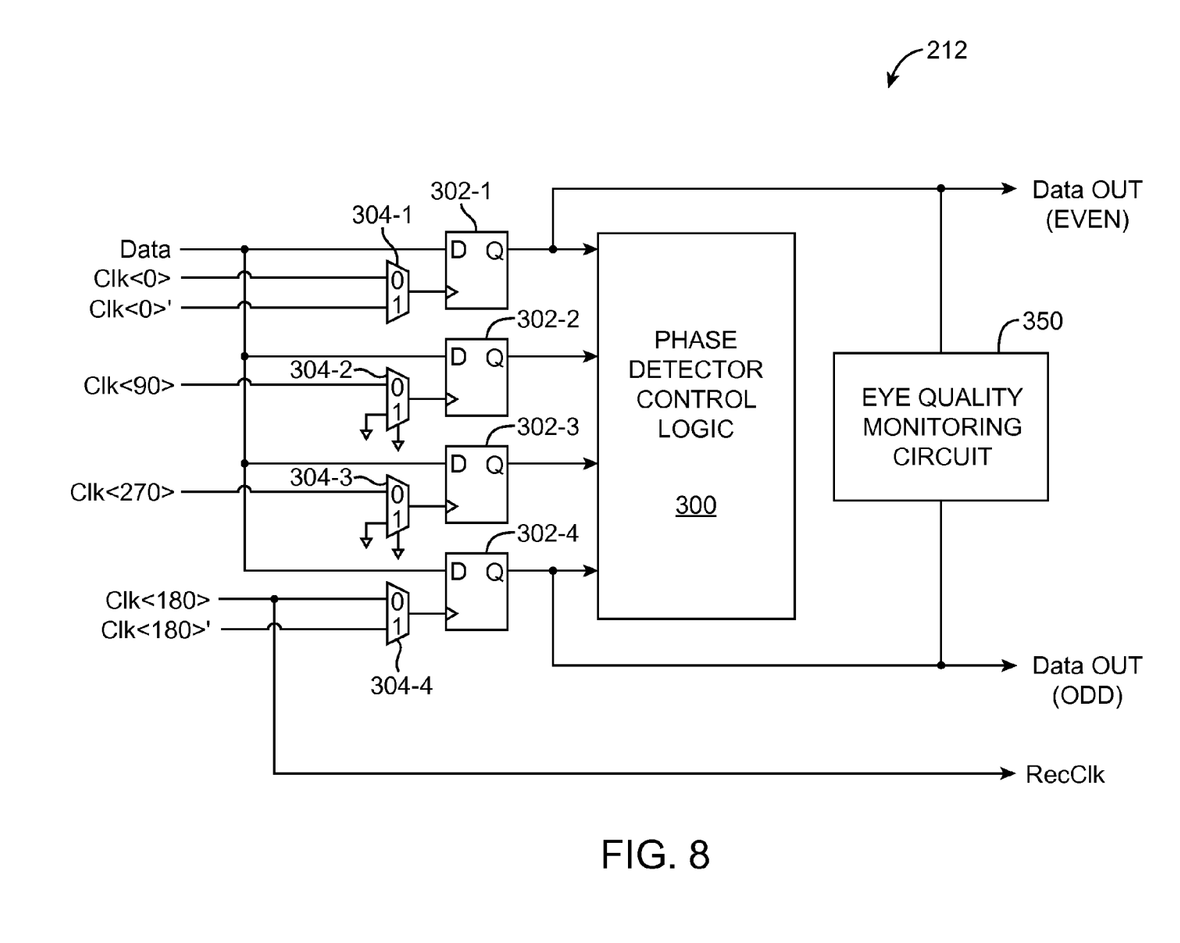
FIG. 8 is a circuit diagram of illustrative data latching circuitry in accordance with an embodiment of the present invention.

FIG. 8 is a circuit diagram showing one suitable arrangement of phase detector 212. As shown in FIG. 8, phase detector 212 may include a control circuit such as phase detector control logic 300, a link performance monitoring circuit such as eye quality monitoring circuit 350, data latching circuitry such as first data latching circuit 302-1, second data latching circuit 302-2, third data latching circuit 302-3, and fourth data latching circuit 302-4, and associated switching circuitry such as multiplexers 304-1, 304-2, 304-3, and 304-4. Data latching circuits 302 (i.e., circuits 302-1, 302-2, 302-3, and 302-4) may, for example, be differential sense amplifier latches.

Each data latching circuit 302 may include a data input (D) that receives incoming data bits Data, a data output (Q) that is coupled to phase detector control logic 300, and a control input. First data latch 302-1 may be coupled to associated multiplexer 304-1. Multiplexer 304-1 may have a first (0) input that receives signal Clk<0>, a second (1) input that receives Clk<0>' (i.e., a clock signal that is slightly phase shifted with respect to Clk<0>), and an output that is coupled to the control input of latch 302-1. Multiplexer 304-1 may be configured to route signals from a selected one of its input to its output (e.g., latch 302-1 may receive either Clk<0> or Clk<0>'). Similarly, fourth data latch 302-4 may be coupled to associated multiplexer 304-4. Multiplexer 304-4 may have a first (0) input that receives signal Clk<180>, a second (1) input that receives signal Clk<180>' (i.e., a clock signal that is slightly phase shifted with respect to Clk<180>), and an output that is coupled to the control input of latch 302-4. Multiplexer 304-4 may be configured to route signals from a selected one of its input to its output (e.g., latch 302-4 may receive either Clk<180> or Clk<180>'). Phase detector control logic 300 may nominally configure multiplexers 304-1 and 304-2 to route signals Clk<0> and Clk<180> to latches 302-1 and 302-4, respectively.

Second data latch 302-2 may be coupled to associated multiplexer 304-2. Multiplexer 304-2 may have a first input that receives signal Clk<90>, a second input that is coupled to a ground line, a control input that is coupled to the ground line, and an output that is coupled to the control input of latch 302-2. Configured in this way, latch 302-2 always receives Clk<90> from multiplexer 304-2. Similarly, third data latch 302-3 may be coupled to associated multiplexer 304-3. Multiplexer 304-3 may have a first input that receives signal Clk<270>, a second input that receives a ground power supply voltage from the ground line, a control input that receives the ground power supply voltage, and an output that is coupled to the control input of latch 302-3. Configured in this way, latch 302-3 always receives Clk<270> from multiplexer 304-3. Multiplexers 304-2 and 304-3 may serve as "dummy" multiplexers for providing gate delays that matches those of multiplexers 304-1 and 304-4 in the first and fourth clock signal paths.

Arranged as such, data captured using latch 302-1 may represent the even data bits, whereas the data captured using latch 302-4 may represent the odd data bits. Meanwhile, data captured using second and third latches 302-2 and 302-3 may represent values near the transition from even to odd bits and values near the transition from odd to even bits, respectively. The captured data may be fed to phase detector control logic 300 to determine whether to issue an up or down pulse to circuitry 204 based on factors described in connection with FIG. 7. In the example of FIG. 8, Clk<180> may be selected as a recovered clock signal RecClk that is fed to deserializer 122 (see, FIG. 1). If desired, any one of PD clock signals Clk<0,90,180,270> can be selected as the recovered clock signal.

Eye quality monitoring circuit 350 may be coupled to the data output terminals for use in obtaining desired link performance measurements. Monitoring circuit 350 may be used to measure bit error rates, eye width W, eye height H, and/or other desired high-speed communications link performance metrics. In practice, it may not always be optimal to position clock edges at the center of each data window. Eye quality monitoring circuit 350 may serve to monitor the link performance for determining the optimal position for the latching clock edges within each data window.

Figure 9:
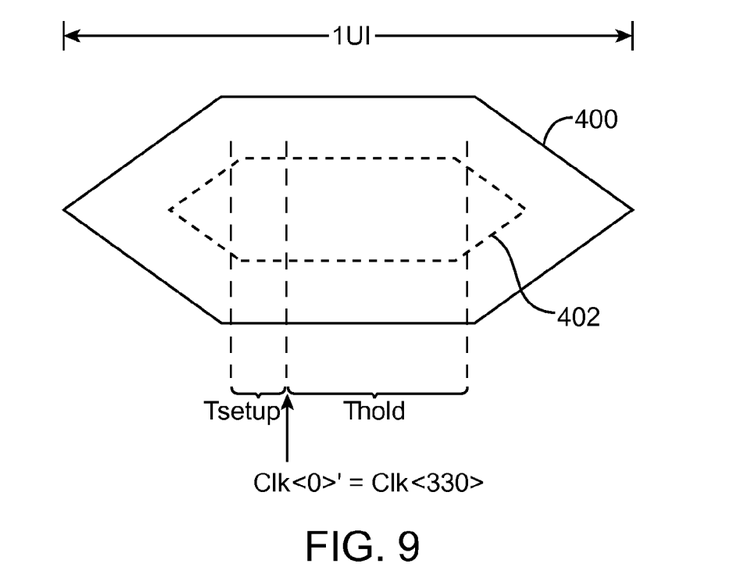
FIG. 9 illustrates an eye diagram having mismatched setup and hold times in accordance with an embodiment of the present invention.

FIG. 9 illustrates one scenario in which setup and hold times associated with the data latching circuits are not equal. In FIG. 9, profile 400 represents an ideal eye opening that is one unit interval (UI) wide, whereas profile 402 represents an actual eye opening that is substantially smaller than ideal opening 400. As described previously in connection with FIG. 3, eye opening 402 that is observed in practice is always smaller than the ideal eye opening 400 in both the time dimension and the voltage dimension due to jitter and noise, respectively.

In scenarios in which setup and hold times are equal, it may be desirable to position the latching clock edges at the center of eye opening 402. In the example of FIG. 9, however, setup time Tsetup is less than hold time Thold. In such scenarios, it may be desirable to shift only the data latching clock signals "left" to take advantage of the smaller setup time. To accomplish this, phase detector control logic 300 may configure multiplexer 304-1 to output Clk<0>' and multiplexer 304-4 to output Clk<180>'. In this example, Clk<0>' may be shifted earlier in time by a phase of 30° (e.g., Clk<0>' is equal to Clk<330>). While data latching clock signals Clk<0>' and Clk<180>' that are different than the nominal PD clock signals are used, the transition latching clock signals Clk<90> and Clk<270> remain unaltered. Doing so should result in an improvement in the link performance as measured by monitoring circuit 350.

The example of FIG. 9 is merely illustrative. In other suitable arrangements, hold time Thold may be less than setup time Tsetup. In such scenarios, it may be desirable to shift only the latching clock signals "right" to take advantage of the smaller hold time. To accomplish this, Clk<0>' may be set equal to a delayed version of Clk<0> (e.g., Clk<0>' may be equal to Clk<45>, which is shifted later in time by 45° with respect to Clk<0>), whereas Clk<180>' may be set equal to a delayed version of Clk<180> (e.g., Clk<180>' may be equal to Clk<225>, which is shifted later in time by 45° with respect to Clk<180>).

The magnitude of Tsetup relative to Thold may be determined by the type of data latching circuit 302 that is used in phase detector 212 to capture the incoming data bits. The phase offset between Clk<0> and Clk<0>' and between Clk<180> and Clk<180>' may therefore be precalibrated based on known setup and hold time mismatch characteristics associated with the particular data latching circuit being used in phase detector 212 or may be determined during runtime by sweeping through different phase settings for Clk<0>' and Clk<180>' and selecting the phase setting that yields the optimal link performance as monitored by circuit 350 (e.g., the optimal phase setting may be selected by comparing error rate measurements obtained at each of the different possible phase settings for the PD clock signals). Signals Clk<0>' and Clk<180>' may be adjusted by the same amount with respect to Clk<0> and Clk<180>. Clock signals Clk<0>' and Clk<180>' may be generated by VCO 206 in addition to the four nominal PD clock signals, by a phase interpolator, or by a delay-chain circuit (as examples).

Figure 10:
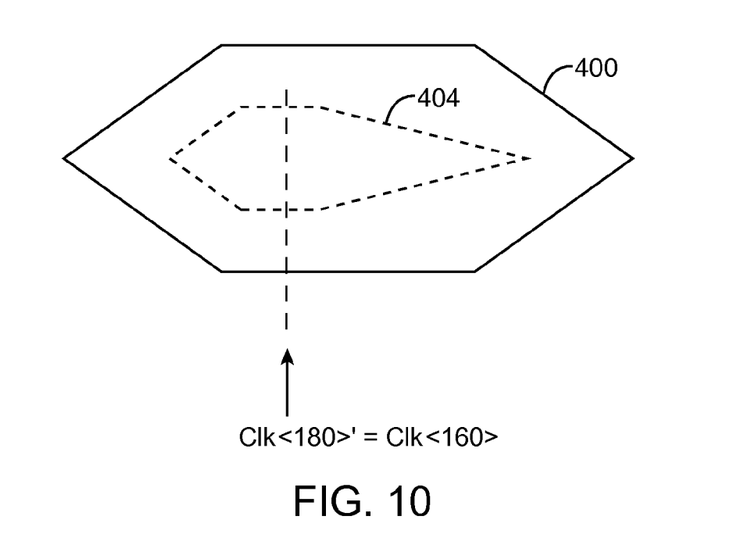
FIG. 10 illustrates a distorted eye diagram in accordance with an embodiment of the present invention.

FIG. 10 illustrates another possible scenario in which the actual data eye opening is distorted (as indicated by distorted opening 404). In FIG. 9, opening 404 is skewed towards the left. This may occur when the equalizer in receiver 118 is not optimized properly, when signals are over-equalized, when a mismatch is present between rise and fall times, etc. In such scenarios, it may be desirable to shift the data latching clock signals "left" to place the latching clock edge closer to the point of the widest eye opening. To accomplish this, phase detector control logic 300 may configure multiplexer 304-1 and multiplexer 304-4 to output Clk<0>' and Clk<180>', respectively. In the example of FIG. 10, Clk<180>' may be shifted earlier in time by a phase of 20° (e.g., Clk<180>' is equal to Clk<160>). Doing so should result in an improvement in the link performance as measured by monitoring circuit 350.

The example of FIG. 10 is merely illustrative. In other suitable arrangements, data eye 404 may be skewed to the right. In such scenarios, it may be desirable to shift only the data latching clock signals "right" to take advantage of the smaller hold time. The phase offset between Clk<0> and Clk<0>' and between Clk<180> and Clk<180>' may be determined based on link calibration results or may be determined during runtime by sweeping through different phase settings for Clk<0>' and Clk<180>' and selecting the phase setting that yields the optimal link performance as monitored by circuit 350.

Figure 11:
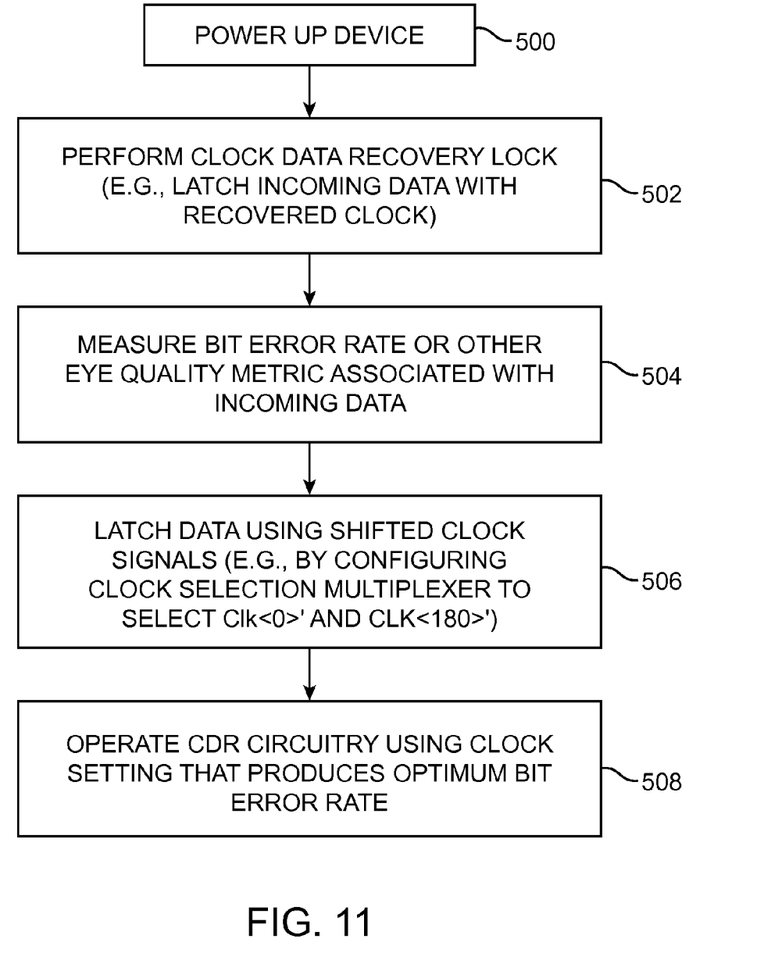
FIG. 11 shows illustrative steps involved in operating an integrated circuit that includes clock data recovery circuitry of the type shown in connection with FIG. 4 in accordance with an embodiment of the present invention.

FIG. 11 shows illustrative steps involved in operating an integrated circuit with CDR circuitry 120. At step 500, the integrated circuit may be powered up. At step 502, an initial clock data recovery lock may be performed (e.g., by locking the frequency of the PD clock signals and by aligning the phase of Clk<90> and Clk<270> to the transitions of the incoming data bits). At step 504, eye quality monitoring circuit 350 may be used to measure the bit error rate (BER) or other eye quality metric associated with the incoming data bits.

At step 506, the incoming data bits may be latched using shifted clock signals (e.g., by configuring clock selection multiplexers 304-1 and 304-4 to select Clk<0>' and Clk<180>' instead of Clk<0> and Clk<180>). Clock signals Clk<0>' and Clk<180>' may be optionally adjusted to exhibit a wide range of phase settings. At step 508, CDR circuitry 120 may select a clock setting that yields the optimal bit error rate as measured by eye quality monitoring circuit 350 (e.g., phase detector control logic 300 may select data latching clock signals that are optimally placed within the even and odd data windows while taking into account any possible mismatch in setup and hold times and possible distortion in the data eye). The steps of FIG. 11 may be performed once during device startup and may be periodically performed during runtime to ensure that the optimal clock phase setting is being used during normal operation.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of operating an integrated circuit that receives incoming data bits, comprising:
    receiving the incoming data bits with data latching circuitry from an external integrated circuit;
    with the data latching circuitry, receiving a first clock signal during a first time period and receiving a second clock signal during a second time period that is different from the first time period, wherein the first and second clock signals have different phase settings;
    using only a selected one of the first and second clock signals to control the data latching circuitry during normal operation of the integrated circuit;
    receiving latched data from the data latching circuitry at control logic; and
    using the control logic to adjust the frequency of the first and second clock signals.

2. The method defined in claim 1, wherein the data latching circuitry includes a multiplexing circuit and a data latch, and wherein each data bit in the incoming data bits is defined within a data window, the method further comprising:
    with the multiplexing circuit, receiving the first and second clock signals and outputting the selected one of the first and second clock signals to the data latch, wherein only one of the first and second clock signals is centered within the data window.

3. The method defined in claim 1, further comprising:
    latching the incoming data bits with the data latching circuitry; and
    with a communications link performance monitoring circuit, obtaining measurements on the latched data bits.

4. The method defined in claim 3, wherein obtaining measurements on the latched data bits comprises obtaining bit error rate measurements.

5. The method defined in claim 3, wherein obtaining the measurements comprises obtaining a first measurement during the first time period and obtaining a second measurement during the second time period, the method further comprising:
    comparing the first and second measurements to determine which one of the first and second clock signals to use in controlling the data latching circuitry.

6. The method defined in claim 1, wherein the integrated circuit further includes an adjustable oscillator circuit, the method further comprising:
    generating the first clock signal using the adjustable oscillator circuit, wherein adjusting the frequency of the first and second clock signals comprises using the control logic to adjust the adjustable oscillator circuit.

7. The method defined in claim 6, further comprising:
    with the adjustable oscillator circuit, generating an additional plurality of clock signals that control the data latching circuitry; and
    aligning clock edges of some of the additional plurality of clock signals with the incoming data bits.

8. An integrated circuit operable to receive incoming data bits, comprising:
    an oscillator that generates first and second clock signals with different clock phases;
    first and second data latches;
    a first multiplexer that receives the first clock signal from the oscillator without receiving the second clock signal and that has an output that is coupled to the first data latch; and
    a second multiplexer that receives the second clock signal from the oscillator without receiving the first clock signal and that has an output that is coupled to the second data latch.

9. The integrated circuit defined in claim 8, wherein the first and second data latches comprise differential sense amplifier latches.

10. The integrated circuit defined in claim 8, further comprising:
    a control logic circuit that receives data captured by the first and second data latches and that controls how the plurality of data latches are being clocked.

11. The integrated circuit defined in claim 10, further comprising:
   a link performance monitoring circuit configured to obtain measurements on data captured by the first and second data latches, wherein operation of the control logic circuit is based on the obtained measurements.

12. A method of operating an integrated circuit that receives serial data stream over a communications link, comprising:
   using a first clock signal to sample a first data bit in the serial bit stream;
   using a second clock signal to sample a second data bit that immediately follows the first data bit in the serial bit stream;
   using a third clock signal to sample a value in the serial data stream where the first data bit transitions into the second data bit; and
   in response to determining that the first sampled data bit is different than the second sampled data bit and that the sampled transition value is equal to the first sampled data bit, slowing down one or more of the first, second, and third clock signals.

13. The method defined in claim 12, further comprising:
   in response to determining that the first sampled data bit is different than the second sampled data bit and that the sampled transition value is equal to the second sampled data bit, speeding up one or more of the first, second, and third clock signals.

14. The method defined in claim 12, further comprising:
   in response to determining that the first sampled data bit is equal to the second sampled data bit, maintaining the frequency of the first, second, and third clock signals.

15. The method defined in claim 12, wherein each data bit in the serial data stream is defined by a data window, the method further comprising:
   with control logic, adjusting the phase of the first and second clock signals without altering the phase of the third clock signal so that clock edges of the first and second clock signals are not centered within each data window.

16. The method defined in claim 15, further comprising:
   with an error rate monitoring circuit, obtaining link performance measurements by monitoring the first and second sampled data bits while the phase of the first and second clocks signals are being adjusted.

17. The integrated circuit defined in claim 8, wherein the first multiplexer comprises a dummy multiplexer having an input that is shorted to ground.

18. The integrated circuit defined in claim 8, wherein the oscillator further generates third and fourth clock signals having different clock phases than the first and second clock signals, the integrated circuit further comprising:
   third and fourth data latches;
   a third multiplexer that routes only the third clock signal to the third data latch;
   a fourth multiplexer that routes only the fourth clock signal to the fourth data latch, wherein the first multiplexer is operable to route only the first clock signal to the first data latch, and wherein the second multiplexer is operable to route only the second clock signal to the second data latch.

19. The integrated circuit defined in claim 18, wherein the first clock signal has a 90 degree phase delay with respect to the third clock signal, wherein the fourth clock signal has a 180 degree phase delay with respect to the third clock signal, and wherein the second clock signal has a 270 degree phase delay with respect to the third clock signal.

20. The integrated circuit defined in claim 18, wherein the first data latch is configured to latch a first data bit in a data stream, wherein the second data latch is configured to latch a second data bit in the data stream, and wherein the third data latch is configured to latch a value in the data stream where the first data bit transitions into the second data bit.

21. The integrated circuit defined in claim 8, wherein the first multiplexer comprises a 2:1 multiplexer that receives only the first clock signal and a shifted version of the first clock signal.

* * * * *